United States Patent [19]

Tekeshita et al.

[11] Patent Number: 5,145,835
[45] Date of Patent: Sep. 8, 1992

[54] PROCESS FOR FABRICATING SUPERCONDUCTING CERAMIC MATERIALS BY HIP TREATMENT

[75] Inventors: Takuo Takeshita, Omiya; Sadaaki Hagino; Tatsuro Ajima, both of Urawa; Motokazu Suzuki, Omiya, all of Japan

[73] Assignee: Mitsubishi Materials Corporation, Tokyo, Japan

[21] Appl. No.: 688,702

[22] Filed: Apr. 22, 1991

Related U.S. Application Data

[63] Continuation of Ser. No. 234,650, Aug. 28, 1988, abandoned.

[30] Foreign Application Priority Data

| | | | |
|---|---|---|---|
| Aug. 21, 1987 | [JP] | Japan | 62-207694 |
| Aug. 26, 1987 | [JP] | Japan | 62-212252 |
| Aug. 26, 1987 | [JP] | Japan | 62-212254 |
| Aug. 28, 1987 | [JP] | Japan | 62-212962 |
| Aug. 28, 1987 | [JP] | Japan | 62-212964 |
| Aug. 28, 1987 | [JP] | Japan | 62-212966 |
| Aug. 28, 1987 | [JP] | Japan | 62-212972 |
| Aug. 31, 1987 | [JP] | Japan | 62-217189 |
| Aug. 31, 1987 | [JP] | Japan | 62-217190 |

[51] Int. Cl.$^5$ .................. H01L 39/24; B22F 7/00
[52] U.S. Cl. ....................... 505/1; 505/704; 427/62; 29/599; 419/19; 419/20; 419/49
[58] Field of Search .............. 505/1, 740, 704; 427/62; 29/599; 419/49, 48, 19, 20

[56] References Cited

U.S. PATENT DOCUMENTS

| | | | |
|---|---|---|---|
| 3,922,769 | 12/1975 | Brenan | 419/418 |
| 4,060,413 | 11/1977 | Mazzei et al. | 75/208 R |
| 4,826,808 | 5/1989 | Yurek et al. | 505/1 |
| 5,004,722 | 4/1991 | Tallman | 505/1 |

FOREIGN PATENT DOCUMENTS

0035784 9/1981 European Pat. Off.

OTHER PUBLICATIONS

McCallum et al 'Problems in the production of YBa$_2$-Cu$_3$O$_x$ Superconducting Wire' Adv. Cera. Mat. vol. 2(3B) July 1987 p. 388–400.

Politis et al 'Superconductivity above 100K in Multiphase Y-Ba-Cu-O' Z. Phys. B—Condensed Matter 66. p. 279-282 Jun. 1987.

Jin et al 'High Tc superconductors–Composite wire fabrication' Appl. Phys. lett. 51(3) July 1987 p. 203–204.

Schirber et al 'Pressure dependence of the supercnducting transition temperature in the 94-K Superconductor YBa$_2$Cu$_3$O$_7$' Phys. Rev. B 35(16) Jun. 1987 p. 8709-8710.

Ohmatsu et al 'Superconducting Wires of High Tc Oxides' Jpn J. Appl. Phys. vol. 26 (Oct. 1987) Supplement 26-3.

Japanese Journal of Applied Physics/Part 2: Letters, vol. 26, No. 4, Apr. 1987 pp. L311-L313, Tokyo JP; R. Yoshizaka, et al.: "Superconducting properties of La1.85Sr0.15CuO4 made by hot-press and sinter methods".

Applied Physics Letters, vol. 51, No. 3, Jul. 20, 1987, pp. 203-204, American Institute of Physics, New York, N.Y. US; S. Jin, et al.: "High Tc superconductors composite wire fabrication".

Materials Research Bulletin, vol. 22, No. 7, Jul. 1987, pp. 995-1006, Pergamon Journals Ltd, US; P. K. Gallagher et al.: "Oxygen stoichiometry in Ba2YCu3Ox".

*Primary Examiner*—Shrive Beck
*Assistant Examiner*—Roy V. King
*Attorney, Agent, or Firm*—Cushman, Darby & Cushman

[57] ABSTRACT

A process for fabricating worked superconducting ceramic material of a mean grain size not more than 10 um is disclosed, which comprises the steps of: (a) preparing a metal casing containing a starting powder material having a composition for forming an oxide superconductor; (b) calcining the starting powder material contained in the casing at a temperature range of 850° to 950° C.; (c) subjecting said casing to a HIP treatment; (d) subjecting said casing containing hot deformed material to cold deformation processing; and (e) subjecting said casing to stress relief treatment by annealing in the presence of oxygen.

10 Claims, No Drawings

PROCESS FOR FABRICATING SUPERCONDUCTING CERAMIC MATERIALS BY HIP TREATMENT

This is a continuation of application Ser. No. 07/234,650, filed on Aug. 28, 1988, now abandoned

BACKGROUND OF THE INVENTION

The present invention relates to a process for fabricating superconducting ceramics materials comprising a yttrium-including rare earth element, an alkaline earth metal and copper oxide (hereinafter referred to as "R-A-Cu-O based ceramics") which has a high theoretical density ratio and thus has a high critical current value.

Conventional processes for fabricating worked materials such as wire rods, plates, strings, coils, and ribbons made of an R-A-Cu-O based superconducting ceramics include a process in which starting powders, i.e., an $R_2O_3$ powder, an alkaline earth metal carbonate powder, and a CuO powder, each having an average grain size of not greater than 10 um, are provided and compounded in a predetermined compounding ratio followed by mixing and compacting them to obtain a compacted body, which is then calcined, e.g., in an atmosphere of dry air, at a temperature of from 850° C. to 950° C. to form a superconducting ceramics having a composition of $YBa_2Cu_3O_7$, for example, the ceramics is then ground to obtain powder of an average grain size of not greater than 10 um and filled in a pipe of silver (Ag) or copper (Cu), and the pipe filled with the ceramics powder is molded into a worked material of a predetermined shape by cold processing such as swaging, rolling with grooved rolls, and processing with a die.

With the above-described conventional processes, it is very difficult to fill superconducting ceramics powder in a metal pipe in a filling ratio of not lower than 50% when fabricating processed superconducting materials or members. Further, it is noted that worked materials fabricated using such compacted body of a low filling ratio when cold processed have a theoretical density ratio of at most about 90%. In addition, it is also difficult upon calcination to fabricate superconducting ceramics with an oxygen content as high as up to 100% of theoretical content, and the resulting suerconducting ceramics tends to lack oxygen. For example, when fabrication of $YBa_2Cu_3O_7$ is contemplated, product has a composition of $YBa_2Cu_3O_{7-d}$ where d indicates degree of deficiency of oxygen. Under the circumstances, high critical current value and high critical temperature of superconducting ceramics worked materials cannot be secured with the conventional processes.

Further, when the above conventional superconducting ceramics material is worked into wire rods and then into coils it tends to suffer decrease in critical current value presumably due to heterogeneity in the density of filled superconducting ceramics powder and/or poor contact or non-contact between the respective grains of superconducting ceramics powder as the result of gap formed or slipping between the grains during working into coils.

SUMMARY OF THE INVENTION

An object of the present invention is to obviate defects of the conventional processes and provide a process for fabricating processed superconducting ceramics materials having a high theoretical density ratio.

Another object of the present invention is to provide a process for fabricating processed superconducting ceramics materials in which deficiency of oxygen can be supplemented with ease.

Still another object of the present invention is to provide a process for fabricating processed superconducting ceramics materials having a high critical current value and a high critical temperature.

Yet another object of the present invention is to provide a process for fabricating processed superconducting ceramics materials with improved crystalline orientation.

Further object of this invention is to provide a process for fabricating worked superconducting ceramics material which is free of heterogeneous portion or portion in which respective grains are in poor contact or non-contact.

As a result of extensive investigation, it has now been found that hot isostatic press treatment when performed to apply force generated by hydrostatic press while heating to any of starting material, intermediate product or final worked R-A-Cu-O-based superconducting ceramics materials, gives rise to compressed body having a theoretical density ratio much higher than that of the processed superconducting ceramics materials fabricated in the conventional manner, and thus final worked ceramics materials fabricated exhibit high critical current value and high critical temperature.

Therefore, the present invention provides a process for fabricating worked superconducting ceramics material composed essentially of a yttrium-including rare earth element, an alkaline earth metal, copper and balance oxygen and unavoidable impurities, and optionally containing a metal originating from an oxygen supply agent, comprising performing hot isostatic press treatment to apply compression force to an object to be compressed at a predetermined timing during the fabrication of worked superconducting ceramics material comprising the steps of:

(A) providing starting powder composed of:
(i) a member selected from the group consisting of:
 (1) a mixt powder composed of powders of component oxides:
  (1-1) a yttrium-including rare earth element oxide,
  (1-2) an alkaline earth metal oxide, and
  (1-3) copper oxide,
  and having a composition substantially the same as that of a contemplated superconducting ceramics,
 (2) a mixt powder composed of powders of:
  (2-1) a partial compound between any two of the component oxides constituting a contemplated supercoductive ceramics secelected from (1-1), (1-2) and (1-3), and
  (2-2) the rest of the component oxides selected from (1-1), (1-2) and (1-3),
  and having a composition substantially the same as that of a contemplated superconducting ceramics,
 (3) powder of a superconducting ceramics composed essentially of a yttrium-including rare earth element, an alkaline earth metal, copper and balance oxygen and unavoidable impurities,
 (4) a mixt powder composed of at least two members selected from the mixt powders (1), (2) and (3); and
(ii) optionally an oxygen-supply agent;

(B) placing the starting powder in a metal casing, and sealing the metal casing;

(C) optionally heat-treating the starting powder in the metal casing when the starting powder is the mixt powder (1-1), (1-2) or (1-4) at a temperature sufficient for calcining the starting powder;

(D) working the metal casing containing the starting powder optionally heat-treated according to the step (C) above into an article having a predetermined form; and (E) optionally heat-treating the article at a temperature of from 300° C. to 950° C.;

the timing of perfoming the hot isostatic press treatment being selected from (i) after the step of (B), (ii) after the step of (C), and (iii) after the step of (D).

In a typical aspect, the present invention provides a process for fabricating superconducting ceramics material composed essentially of a yttrium-including rare earth element, an alkaline earth metal, copper and balance oxygen and unavoidable impurities, and optionally containing a metal originating from an oxygen supply agent, comprising:

(a) providing starting powder composed of:
(i) a member selected from the group consisting of:
  (1) a mixt powder composed of powders of component oxides:
    (1-1) a yttrium-including rare earth element oxide,
    (1-2) an alkaline earth metal oxide, and
    (1-3) copper oxide,
    and having a composition substantially the same as that of a contemplated superconducting ceramics,
  (2) a mixt powder composed of powders of:
    (2-1) a partial compound between any two of the component oxides constituting a contemplated supercoductive ceramics secelected from (1-1), (1-2) and (1-3), and
    (2-2) the rest of the component oxides selected from (1-1), (1-2) and (1-3),
    and having a composition substantially the same as that of a contemplated superconducting ceramics,
  (3) powder of a superconducting ceramics composed essentially of a yttrium-including rare earth element, an alkaline earth metal, copper and balance oxygen and unavoidable impurities,
  (4) a mixt powder composed of at least two members selected from the mixt powders (1), (2) and (3); and
(ii) optionally an oxygen-supply agent;

(b) placing the starting powder in a metal casing and sealing the metal casing;

(c) subjecting the starting powder through the metal casing to hot isostatic press treatment to render the starting powder compressed;

(d) optionally heat-treating the starting powder when the starting powder is the mixt powder (1-1), (1-2) or (1-4) at a temperature sufficient for calcining the starting powder prior to or after subjecting it to the hot isostatic press treatment;

(e) processing the compressed product to produce an article having a predetermined form; and (f) optionally heat-treating the article at a temperature of from 300° C. to 950° C.

In another typical aspect, the present invention provides a process for fabricating worked superconducting ceramics material composed essentially of a yttrium-including rare earth element, an alkaline earth metal, copper and balance oxygen and unavoidable impurities, and optionally containing a metal originating from an oxygen supply agent, comprising:

1) working a wire rod composed of a metal sheath and a core into a wire rod, the core being composed of:
(1) powder of a superconducting ceramics composed essentially of a yttrium-including rare earth element, an alkaline earth metal, copper and balance oxygen and unavoidable impurities, and
(2) optionally an oxygen-supply agent, and
2) performing hot isostatic press treatment to apply compression force to the wire rod.

DETAILED DESCRIPTION OF THE INVENTION

Hereinafter, description will at first be made on a typical embodiment of the present invention, in which HIP treatment is performed before working the superconducting ceramics material into an article and the starting material for fabricating processed superconducting ceramics material is powder of a superconducting ceramics (R-A-Cu-O) composed essentially of a yttrium-including rare earth element (R), an alkaline earth metal (A), copper (Cu), and balance oxygen (O) and unavoidable impurities.

Suitable examples of the yttrium-including rare earth element which can be used include yttrium (Y), erbium (Er), dysprosium (Dy), ytterbium (Yb), gadolinium (Gd), thulium (Tm), neodymium (Nd), (Lu), and samarium (Sm). Of these, yttrium is preferred. The yttrium-including rare earth elements can be used singly or in combination.

Suitable examples of the alkaline earth metal which can be used in the present invention include barium, strontium and calcium, with barium being preferred. The alkaline earth metal can be used singly or in combination.

Powder of superconducting ceramics which can be used as a starting powder in the process of the present invention can be prepared, e.g., by calcining a mixture of single component oxides with a composition substantially the same as that of a contemplated ceramics material or article in an oven at a temperature suitable for preparing ceramics, e.g., 300° to 950° C., and grinding the resulting superconducting ceramics material to have a desired mean grain size, e.g., not greater than 10 um. Generally, smaller mean grain size, e.g., not greater than 5 um, is preferred. Of course, it is possible to use superconducting ceramics material otherwise prepared as far as it has a composition of R-A-Cu-O, e.g., $YBa_2Cu_3O_7$, to be fabricated after grinding, if desired. Examples of known ceramics include those described, e.g., in Tomoji Kawai and Masaki Kanai, *Japanese Journal of Applied Physics*, vol. 26, No. 5, May, 1987, pp. L736–L737; and Masanobu Kobayashi et al., ibid. pp. L754–L756.

The starting powder is filled and sealed in a metal casing or sheath. Preferably, the metal sheath which can permeate oxygen is used. Suitable examples of the metal which can be used include copper, aluminum, and silver. Silver based alloys which may contain one or more other elements such as platinum as far as they do not react with ceramics and they give a good influence on the strength of wire rod to be fabricated upon drawing.

The shape of the casing is not limited and can be of any desired form depending on the shape of articles to be contemplated as far as it is suited for holding and sealing therein starting powder.

After filling the starting powder in the metal casing, the casing is sealed. Sealing can be performed in the air or in vacuo. The metal casing containing the starting powder is then subjected to hot isostatic press treatment (hot hydrostatic press treatment, hereinafter sometimes referred to as "HIP treatment") to compress it.

After the compression, the resulting superconducting ceramics material is then cold- or hot-processed, e.g., by swaging, processing with grooved rolls, processing with a die, or a like, to produce articles having a desired shape, e.g., wire rods, plates, ribbons, strings, coils and the like. Also, the superconducting ceramics article surrounded by the metal casing can be processed so that at least one portion of the ceramics has an open surface; in other words, a part of or the whole metal sheath can be removed from the superconducting ceramics material as by grinding or other conventional means. During the above-described processing, annealing may be performed, if desired.

When superconducting ceramics wire rods and similar articles are to be fabricated, it is practically useful to process the wire rods such that the reduction of area of the wire rod is not less than 60% of the original one in order to increase critical current and critical temperature of the superconducting ceramics article.

Then, the processed materials can be heat-treated generally at a temperature of 300° C. to 950° C., preferably from 850° C. to 950° C., and more preferably from 900° C. to 940° C. in order to relieve or relax stress generated during processing, and/or the heat-treatment serves to increase the oxygen content of the superconducting ceramics material.

It is very often the case that oxygen in the resulting ceramics is deficient, with the result that characteristics such as critical current and critical temperature of the superconductive ceramics material obtained are unsatisfactory. It is advantageous to add powder of an oxygen-supply agent composed of a metal oxide to the starting powder prior to being filled in the metal casing in order to supplement oxygen, which tends to be deficient in superconducting ceramics material, during the compression and/or heat-treatment after processing.

Examples of the metal oxide which can be used for this purpose include $Ag_2O$, $MnO_2$, $MoO_3$, $WO_3$, $V_2O_5$ and $Ti_3O_5$. The amount of the oxygen-supply agent to be added is preferably 1 to 5% by weight based on the total powder composition. When the starting powder composition containing powder of the metal oxide as an oxygen-supply agent, filled in the metal casing, is compressed or heated the metal oxide releases oxygen to compensate the ceramics composition for the deficiency of oxygen to increase the theoretical oxygen content ratio of the ceramics.

Alternative approach for increasing the theoretical oxygen content ratio is to provide an oxide layer on the inner surface of the metal sheath as by oxidizing the inner surface of the sheath by heating it in the air prior to introducing therein the starting powder.

It is sometimes useful to add the oxygen-supply agent in the starting superconducting ceramics powder and at the same time provide an oxide layer on the inner surface of the metal sheath.

In another typical embodiment of the present invention in which HIP treatment is performed prior to working the superconducting ceramics material into an article, processed superconducting ceramics materials or superconducting ceramics articles can generally be fabricated starting from a mixture of powder of a yttrium-including rare earth element oxide ($R_2O_3$), powder of an alkaline earth metal oxide (AO) and powder of copper oxide (CuO). The composition of these single component oxides are blended so that the resulting mixture has a composition substantially the same as that of a final superconducting ceramics article.

Examples of the yttrium-including rare earth element oxide which can be used include oxides of yttrium-including rare earth element. The same yttrium-including rare earth elements described above with respect to the preceding embodiment can also be used in the instant embodiment. Of the oxides, generally yttrium oxide is preferred. The yttrium-including rare earth elements can be used singly or in combination with each other.

Examples of the alkaline earth metal oxide which can be used in the present invention include oxides of barium, otrontium and saleium. Darium oxide is preferred. The alkaline earth metal oxides can be used singly or in combination.

The single component oxides, i.e., powder of a rare earth element oxide, powder of an alkaline earth metal oxide and powder of copper oxide, each are commercially available. They can be used as they are or after being ground in order to ajust the mean grain size to a desired size. Usually, single component oxide powders to be used have a mean grain size of not greater than 10 um. Generally, smaller mean grain size, e.g., not greater than 5 um, is preferred.

The single component powders are well mixed with each other in a predetermined ratio appropriate for fabricating a contemplated superconducting ceramics material and the resulting mixt powder composition as a starting material is filled and sealed in a metal casing or sheath. The same metal casing described above with respect to the embodiment in which powder of superconducting ceramics powder is used as a starting powder.

After filling the mixt powder composition in the metal casing, the casing is sealed. Sealing can be performed in the air or in vacuo. The metal casing containing the starting powders is then subjected to calcination and compression by HIP treatment. The calcination and compression or HIP operations may be conducted in this order or in reverse order.

The calcination of the mixt powder composition, which may be prior to or after being subjected to HIP treatment, can be performed at a predetermined temperature, preferably ranging from 850° C. to 950° C., more preferably from 900° C. to 940° C., in the air for a period sufficient to convert the mixt powder composition into a superconductive ceramics.

The mixt powder composition can be compressed by HIP treatment prior to or after being subjected to calcination under the conditions described above. The hydrostatic force while heating is applied to the mixt powder composition prior to or after conversion of the composition into ceramics from outside the metal casing in the same manner as described above with respect to the embodiment starting from the superconducting ceramics powder.

After the calcination and HIP treatment in this order or in reverse order, the resulting superconducting ceramics is then cold- or hot-processed, which can be performed in the same manner as in the case of the HIP-treated superconducting ceramics material starting from the superconducting ceramics powder.

The processed materials can be heat-treated in the same manner as in the case of one fabricated starting from the superconducting ceramics powder.

Further, it is advantageous to add an oxygen-supply agent to the starting single component oxide powders and/or to provide an oxide layer on the inner surface of the metal casing in the same manner as the superconducting ceramics article fabricated starting from the superconducting ceramics powder. The same kind and amount of the oxygen-supply agent as described above can be used. When the mixt powder composition containing powder of the metal oxide as an oxygen-supply agent, filled in the metal casing, is calcined, the metal oxide powder releases oxygen, which compensates the ceramics composition for the deficiency of oxygen to increase the theoretical oxygen content ratio of the ceramics. Substantially no difference is observed whether the mixed powder composition containing an oxygen-supply agent is at first subjected to calcination or to HIP treatment.

Further, according to a variation of the above-described embodiments, powder of partial compounds between any two of the component oxides for fabricating superconducting ceramics articles, i.e., a compound between the yttrium-including rare earth element and the alkaline earth metal oxide, a compound between the alkaline earth metal and copper oxide, and a compound between copper oxide and the yttrium-including rare earth element, can be used together with powder of the remainder of the component oxides, i.e., copper oxide, the yttrium-including rare earth element, and the alkaline earth metal, respectively, instead of using a mixture of powders of single component oxides alone as a starting powder. For example, Y-Ba-CuO based superconducting ceramics articles can be fabricated using $Y_2O_3$. BaO and CuO in a composition substantially the same as that of the final ceramics. Other combinations such as $CuO.BaO$, and $Y_2O_3.CuO$, together with $Y_2O_3$, respectively, can also be used. Similarly, partial compounds can be used for ceramics compositions containing other yttrium-including rare earth elements.

The partial compounds between any two of the single component oxides for fabricating superconducting ceramics material can be commercially available or can be prepared in conventional manner, e.g., by calcining a mixture of powders of any two of the single component oxides described above in an oven at temperatures suitable for preparation of ceramics.

The ratio of powder of the partial compound to the remainder single component oxide which can be added is not critical as far as the resulting mixture has a composition substantially the same as that of a finally obtained superconducting ceramics article.

According to another variation, the mixt powder of the single component oxides, and/or the mixt powder of the partial compound and the remainder of the single component oxides, can be added to powder of the superconducting ceramics powder. In this case, the mixing ratio therebetween is not critical.

In the above-described variations, a processed superconducting ceramics can be obtained with substantially the same operations including calcination, HIP treatment and processing under substantially the same conditions as in the case of superconducting ceramics article obtained starting from a mixture of powders of single component oxides, and detailed explanation is omitted herein.

In another embodiment of this invention, HIP treatment is performed onto worked superconducting ceramics material.

Typical examples of the worked superconducting ceramics material which can be used include a wire rod composed of a metal sheath or tube such as Ag, Cu, stainless steel and Ni alloy, preferably Ag, and a core composed of a superconducting ceramics powder composed essentially of of a yttrium-including rare earth element, an alkaline earth metal, copper and balance oxygen and unavoidable impurities. The core may further contain an oxygen-supply agent.

The superconducting ceramics as a core may be the same as those used in the above-described embodiments of this invention, and it may preferably have a perovskite structure.

As the oxygen-supply agent can be used the same metal oxides described above with respect to the preceding typical embodiments of this invention in the same amounts as used therein. In addition, an oxide layer may be provided in the inner surface of the metal sheath similarly to the above-described embodiments, if desired.

The core composed of superconducting ceramics powder and optionally the oxygen-supply agent may be introduced into the metal sheath in the same manner as described hereinbefore and the thus-filled metal sheath may be worked into a wire rod having a predetermined diameter as by cold processing or working such as swaging, rolling with groved rolls, and die-processing conventionally used in the art.

The thus-worked material, i.e., wire rod is then further worked into a coil in a conventional manner.

HIP treatment of the coil thus obtained can be performed in the same manner as in the above-described embodiments.

If desired, the coil may be heat-treated in the same manner as in the above-described embodiments prior to or after HIP treatment.

According to this embodiment, not only theoretical density ratio of the superconducting ceramics powder in the article can be increased but also heterogeneity and poor contact or non-contact portion in the worked superconducting ceramics material can be avoided.

EXAMPLES

The present invention will be explained in greater detail with reference to the following examples, which should in no way be construed as limiting the present invention.

In tables, "rem." stands for "remainder".

EXAMPLE 1

Various starting powders composed of R-A-Cu-O based superconducting ceramics powders having mean grain sizes and compositions as shown in Table 1a below were filled into a cylindrical casing made of Cu having a size of 17 mm in inner diameter, 1.5 mm thick and 200 mm long at a filling ratio of 50%, and the thus-filled casing was placed in a conventional HIP apparatus. HIP treatment was performed under the following conditions:

| Pressure: | 1700 atm |
|---|---|
| Temperature: | 750° C., and |

Retention Time: 1 hour thus forming a compressed body having a theoretical density ratio shown in Table 1b below. The compressed body was cold processed by subjecting it to swaging and grooved roll-processing, each in a plurality of times, followed by drawing the product into wire rod at an area reduction shown in Table 1b below to obtain wire rods. The wire rods were annealed for stress-relief at a predetermined temperature in the range of from 300° C. to 500° C. to fabricate superconducting ceramics wire rods.

For comparison, the same procedures as above were repeated except HIP treatment was omitted to obtain comparative wire rods.

The theoretical density ratio and critical current (Jc) of the superconducting ceramics wire rods thus obtained were determined and the results obtained are shown in Table 1b.

From the results shown in Table 1a and 1b below, it can be seen that the superconducting ceramics wire rods fabricated according to the process of the present invention had a theoretical density ratio much higher than that of the comparative wire rods. These results correspond to high critical current.

TABLE 1a

| Run No. | Starting Powder Composition (wt. %) | | | | Mean Grain Size (um) |
|---|---|---|---|---|---|
| | R | A | Cu | O | |
| 1-1 | Y: 13.3 | Ba: 41.2 | 28.6 | rem. | 0.9 |
| 1-2 | Er: 22.5 | Ba: 36.9 | 25.6 | rem. | 3.5 |
| 1-3 | Dy: 22.0 | Ba: 37.1 | 25.8 | rem. | 3.2 |
| 1-4 | Yb: 23.1 | Ba: 36.6 | 25.4 | rem. | 4.2 |
| 1-5 | Cd: 21.4 | Ba: 37.4 | 26.0 | rem. | 3.1 |
| 1-6 | Tm: 22.6 | Ba: 36.8 | 25.5 | rem. | 3.8 |
| 1-7 | Nd: 20.0 | Ba: 38.1 | 26.5 | rem. | 4.1 |
| 1-8 | Lu: 23.3 | Ba: 36.5 | 25.3 | rem. | 3.6 |
| 1-9 | Sm: 20.7 | ba: 37.7 | 26.2 | rem. | 3.5 |
| 1-10 | Y: 13.5 | Ba: 37.7 Sr: 2.7 | 29.0 | rem. | 4.1 |
| 1-11 | Lu: 23.5 | Ba: 35.1 Ca: 0.5 | 25.7 | rem. | 3.2 |
| 1-12 | Same as 1-1 above | | | | |
| 1-13 | Same as 1-2 above | | | | |
| 1-14 | Same as 1-3 above | | | | |
| 1-15 | Same as 1-4 above | | | | |
| 1-16 | Same as 1-5 above | | | | |
| 1-17 | Same as 1-6 above | | | | |
| 1-18 | Same as 1-7 above | | | | |
| 1-19 | Same as 1-8 above | | | | |
| 1-20 | Same as 1-9 above | | | | |
| 1-21 | Same as 1-10 above | | | | |
| 1-22 | Same as 1-11 above | | | | |

TABLE 1b

| Run | Theoretical Density Ratio After HIP (%) | Area Reduction (%) | Characteristics of Wire Rod | | |
|---|---|---|---|---|---|
| | | | Diameter of Wire Rod (mm) | Theoretical Density Ratio of Wire Rod (%) | Critical Current (A/cm$^2$) |
| 1-1 | 99.9 | 99 | 1.4 | 99.9 | 6400 |
| 1-2 | 99.6 | 99 | 1.4 | 99.5 | 3200 |
| 1-3 | 99.7 | 95 | 3.1 | 99.7 | 3900 |
| 1-4 | 99.8 | 95 | 3.1 | 99.8 | 5300 |
| 1-5 | 99.6 | 95 | 3.1 | 99.7 | 5700 |
| 1-6 | 99.7 | 95 | 3.1 | 99.6 | 4200 |
| 1-7 | 99.8 | 99 | 1.4 | 99.9 | 3600 |
| 1-8 | 99.5 | 99 | 1.4 | 99.6 | 4100 |
| 1-9 | 99.8 | 99 | 1.4 | 99.7 | 3700 |
| 1-10 | 99.7 | 99 | 1.4 | 99.8 | 4800 |
| 1-11 | 99.4 | 99 | 1.4 | 99.6 | 4900 |
| 1-12 | — | Same as 1-1 above | | 86.5 | 150 |
| 1-13 | — | Same as 1-2 above | | 84.0 | 30 |
| 1-14 | — | Same as 1-3 above | | 81.7 | 20 |
| 1-15 | — | Same as 1-4 above | | 83.5 | 30 |
| 1-16 | — | Same as 1-5 above | | 86.5 | 30 |
| 1-17 | — | Same as 1-6 above | | 85.5 | 20 |
| 1-18 | — | Same as 1-7 above | | 84.4 | 30 |
| 1-19 | — | Same as 1-8 above | | 84.0 | 60 |
| 1-20 | — | Same as 1-9 above | | 85.5 | 20 |
| 1-21 | — | Same as 1-10 above | | 87.1 | 150 |
| 1-22 | — | Same as 1-12 above | | 83.5 | 70 |

EXAMPLE 2

R-A-Cu-O based superconducting ceramics powder having mean grain sizes and compositions as shown in Table 2a below and a metal oxide powder as an oxygen-supply agent as shown in Table 2a below were blended at a blend ratio shown in Table 2a. After mixing, the resulting starting powder compositions were each filled into a cylindrical casing made of Cu having a size of 17 mm in inner diameter, 1.5 mm thick and 200 mm long at a filling ratio of 50%. After sealing it in vacuo, the thus-filled casing was placed in a conventional HIP apparatus. HIP treatment was performed under the following conditions:

| Pressure: | 1700 atm |
|---|---|
| Temperature: | 750° C., and |

Retention Time: 1 hour thus forming a compressed body having a theoretical density ratio shown in Table 2b below. The compressed body was cold processed by subjecting it to swaging and grooved roll-processing, each in a plurality of times, followed by drawing the product into wire rod at an area reduction shown in Table 2b below to obtain wire rods. The wire rods were annealed for stress-relief at a predetermined temperature in the range of from 300° C. to 500° C. to fabricate R-A-Cu-O type superconducting ceramics wire rods.

For comparison, R-A-Cu-O based superconducting ceramics powder having a mean grain size and composition shown in Table 2a was filled in the same cylindrical Cu casing as described above at a filling ratio of 50%. After sealing it in vacuo, the casing was immediately cold processed under the same conditions as above to obtain wire rod, which was then heat-treated at a predetermined temperature in the range of from 300° to 500° C. for 10 to 20 minutes to anneal it for stress relief, thus producing comparative wire rods.

The theoretical density ratio, theoretical oxygen content ratio, critical temperature (Tc) and critical current (Jc) of the superconducting ceramics wire rods thus obtained were determined and the results obtained are shown in Table 2c.

From the results shown in Table 2c below, it can be seen that the superconducting ceramics wire rods fabricated according to the process of the present invention had a theoretical density ratio and a theoretical oxygen content ratio much higher than those of the comparative wire rods. These results correspond to high critical current and high critica temperature.

TABLE 2a

| Run No. | Starting Powder Composition (wt. %) | | | | Mean Grain Size (um) | Content |
|---|---|---|---|---|---|---|
| | R | A | Cu | O | | |
| 2-1 | Y: 13.3 | Ba: 41.2 | 28.6 | rem. | 0.5 | 98.0 |
| 2-2 | Er: 22.5 | Ba: 36.9 | 25.6 | rem. | 0.7 | 97.0 |
| 2-3 | Dy: 22.0 | Ba: 37.1 | 25.8 | rem. | 1.0 | 98.8 |
| 2-4 | Yb: 23.1 | Ba: 36.6 | 25.4 | rem. | 1.2 | 97.5 |
| 2-5 | Gd: 21.4 | Ba: 37.4 | 26.0 | rem. | 2.0 | 99.0 |
| 2-6 | Tm: 22.6 | Ba: 36.8 | 25.5 | rem. | 0.6 | 98.8 |
| 2-7 | Nd: 20.0 | Ba: 38.1 | 26.5 | rem. | 2.5 | 97.0 |
| 2-8 | Lu: 23.3 | Ba: 36.5 | 25.3 | rem. | 3.0 | 98.8 |
| 2-9 | Sm: 20.7 | Ba: 37.7 | 26.2 | rem. | 3.1 | 99.0 |
| 2-10 | Y: 13.5 | Ba: 37.7 Sr: 2.7 | 29.0 | rem. | 0.8 | 98.5 |
| 2-11 | Lu: 23.5 | Ba: 35.1 Ca: 0.5 | 25.7 | rem. | 2.0 | 99.0 |
| 2-12 | Same as 2-1 above | | | | | 100 |
| 2-13 | Same as 2-2 above | | | | | 100 |

TABLE 2a-continued

| Run No. | Starting Powder Composition (wt. %) | | | | Mean Grain Size (um) | Content |
|---|---|---|---|---|---|---|
| | R | A | Cu | O | | |
| 2-14 | Same as 2-3 above | | | | | 100 |
| 2-15 | Same as 2-4 above | | | | | 100 |
| 2-16 | Same as 2-5 above | | | | | 100 |
| 2-17 | Same as 2-6 above | | | | | 100 |
| 2-18 | Same as 2-7 above | | | | | 100 |
| 2-19 | Same as 2-8 above | | | | | 100 |
| 2-20 | Same as 2-9 above | | | | | 100 |
| 2-21 | Same as 2-10 above | | | | | 100 |
| 2-22 | Same as 2-11 above | | | | | 100 |

TABLE 2b

| Run | Oxygen Supply Agent | | |
|---|---|---|---|
| | Composition | Mean Grain Size (um) | Content (wt. %) |
| 2-1 | $Ag_2O$ | 5 | 2.0 |
| 2-2 | $MnO_2$ | 6 | 3.0 |
| 2-3 | $MoO_3$ | 4 | 1.2 |
| 2-4 | $Ag_2O$ | 5 | 2.0 |
| | $V_2O_3$ | 8 | 0.5 |
| 2-5 | $WO_3$ | 6 | 1.0 |
| 2-6 | $V_2O_3$ | 8 | 1.2 |
| 2-7 | $Ag_2O$ | 5 | 3.0 |
| 2-8 | $V_2O_3$ | 8 | 0.7 |
| | $Ti_3O_5$ | 4 | 0.5 |
| 2-9 | $Ti_3O_5$ | 4 | 1.0 |
| 2-10 | $MnO_2$ | 6 | 0.5 |
| | $WO_3$ | 7 | 1.0 |
| 2-11 | $Ti_3O_5$ | 4 | 1.0 |
| 2-12 | — | — | — |
| 2-13 | — | — | — |
| 2-14 | — | — | — |
| 2-15 | — | — | — |
| 2-16 | — | — | — |
| 2-17 | — | — | — |
| 2-18 | — | — | — |
| 2-19 | — | — | — |
| 2-20 | — | — | — |
| 2-21 | — | — | — |
| 2-22 | — | — | — |

TABLE 2c

| Run | Theoretical Density Ratio Aft. HIP (%) | Area Reduction (%) | Diameter of Wire Rod (mm) | Heat Treatment | | Jc (A/cm$^2$) | Tc (°K.) |
|---|---|---|---|---|---|---|---|
| | | | | Theoretical Density Ratio (%) | Theoretical Oxygen Content Ratio (%) | | |
| 2-1 | 99.0 | 98 | 2.0 | 99.9 | 99.9 | 5000 | 99 |
| 2-2 | 99.0 | 98 | 2.0 | 99.8 | 99.9 | 2900 | 95 |
| 2-3 | 98.8 | 90 | 3.8 | 99.5 | 99.8 | 3600 | 93 |
| 2-4 | 99.2 | 95 | 3.1 | 99.8 | 99.9 | 4900 | 96 |
| 2-5 | 99.3 | 95 | 3.1 | 99.6 | 99.8 | 5400 | 94 |
| 2-6 | 98.7 | 98 | 2.0 | 99.2 | 99.7 | 3100 | 93 |
| 2-7 | 99.2 | 98 | 2.0 | 99.8 | 99.8 | 3300 | 94 |
| 2-8 | 99.3 | 90 | 3.8 | 99.8 | 99.6 | 3200 | 93 |
| 2-9 | 99.5 | 90 | 3.8 | 99.7 | 99.8 | 3300 | 95 |
| 2-10 | 99.2 | 95 | 3.1 | 98.7 | 99.5 | 4200 | 98 |
| 2-11 | 99.6 | 95 | 3.1 | 99.9 | 99.6 | 4100 | 90 |
| 2-12 | — | Same as 2-1 above | | 89.4 | 99.2 | 210 | 90 |
| 2-13 | — | Same as 2-2 above | | 88.3 | 99.1 | 55 | 88 |
| 2-14 | — | Same as 2-3 above | | 87.2 | 99.0 | 62 | 87 |
| 2-15 | — | Same as 2-4 above | | 83.8 | 99.0 | 83 | 87 |
| 2-16 | — | Same as 2-5 above | | 85.0 | 99.0 | 115 | 86 |
| 2-17 | — | Same as 2-6 above | | 82.6 | 99.0 | 20 | 87 |
| 2-18 | — | Same as 2-7 above | | 83.4 | 98.9 | 30 | 85 |
| 2-19 | — | Same as 2-8 above | | 88.5 | 99.0 | 65 | 87 |
| 2-20 | — | Same as 2-9 above | | 89.0 | 99.1 | 190 | 86 |
| 2-21 | — | Same as 2-10 above | | 83.6 | 99.0 | 85 | 86 |
| 2-22 | — | Same as 2-11 above | | 85.6 | 98.9 | 120 | 85 |

EXAMPLE 3

Various starting powders composed of R-A-Cu-O based superconducting ceramics powders having mean grain sizes and compositions as shown in Table 3a below were filled at a filling ratio of 50% into a cylindrical casing made of Cu having a size of 17 mm in inner diameter, 1.5 mm thick and 200 mm long and having formed on its inner surface an oxide layer of a thickness of 30 um by holding it in the air at a temperature of 450° C. for 10 hours, and the thus-filled casing was placed in a conventional HIP apparatus. HIP treatment was performed under the following conditions:

| | |
|---|---|
| Pressure: | 1700 atm |
| Temperature: | 850° C., and |
| Retention Time: | 1 hour | thus forming a compressed body having a theoretical density ratio shown in Table 3b below. The compressed body was cold processed by subjecting it to swaging and grooved roll-processing, each in a plurality of times, followed by drawing the product into wire rod at an area reduction shown in Table 3b below to obtain wire rods. The wire rods were annealed for stress-relief at a predetermined temperature in the range of from 300° C. to 500° C. for a predetermined period of time in the range of 20 to 60 minutes in an oxygen-containing atmosphere with a partial pressure of oxygen of 2 atm, thus fabricating R-A-Cu-O type superconducting ceramics wire rods.

For comparison, the same procedures as above were repeated except that Cu casing without having formed an oxide layer on its inner surface was used and that HIP treatment was omitted to obtain comparative wire rods.

The theoretical density ratio, theoretical oxygen content ratio, critical temperature (Tc) and critical current (Jc) of the superconducting ceramics wire rods thus obtained were determined and the results obtained are shown in Table 3c.

From the results shown in Table 3c below, it can be seen that the superconducting ceramics wire rods fabricated according to the process of the present invention had a theoretical density ratio much higher than that of the comparative wire rods. These results correspond to high critical current.

TABLE 3a

| Run No. | Starting Powder Composition (wt. %) | | | | Mean Grain Size (um) |
|---|---|---|---|---|---|
| | R | A | Cu | O | |
| 3-1 | Y: 13.3 | Ba: 41.2 | 28.6 | rem. | 0.7 |
| 3-2 | Er: 22.5 | Ba: 36.9 | 25.6 | rem. | 2.4 |
| 3-3 | Dy: 22.0 | Ba: 37.1 | 25.8 | rem. | 3.1 |
| 3-4 | Yb: 23.1 | Ba: 36.6 | 25.4 | rem. | 2.6 |
| 3-5 | Cd: 21.4 | Ba: 37.4 | 26.0 | rem. | 3.7 |
| 3-6 | Tm: 22.6 | Ba: 36.8 | 25.5 | rem. | 3.4 |
| 3-7 | Nd: 20.0 | Ba: 38.1 | 26.5 | rem. | 4.2 |
| 3-8 | Lu: 23.3 | Ba: 36.5 | 25.3 | rem. | 3.7 |
| 3-9 | Sm: 20.7 | Ba: 37.7 | 26.2 | rem. | 3.5 |
| 3-10 | Y: 13.5 | Ba: 37.7 Sr: 2.7 | 29.0 | rem. | 4.1 |
| 3-11 | Lu: 23.5 | Ba: 35.1 Ca: 0.5 | 25.7 | rem. | 3.0 |
| 3-12 | Same as 3-1 above | | | | |
| 3-13 | Same as 3-2 above | | | | |
| 3-14 | Same as 3-3 above | | | | |
| 3-15 | Same as 3-4 above | | | | |
| 3-16 | Same as 3-5 above | | | | |
| 3-17 | Same as 3-6 above | | | | |
| 3-18 | Same as 3-7 above | | | | |
| 3-19 | Same as 3-8 above | | | | |
| 3-20 | Same as 3-9 above | | | | |
| 3-21 | Same as 3-10 above | | | | |
| 3-22 | Same as 3-11 above | | | | | in the metal casing into supercoducting ceramics, which was then placed in a conventional HIP apparatus. HIP treatment was performed under the conditions:

| Pressure: | 1700 atm |
|---|---|
| Temperature: | 850° C. |
| Retention Time: | 1 hour | thus formiong compressed body having a theoretical density ratio as shown in Table 4b below. The compressed body was cold processed by subjecting it to swinging and grooved roll-processing, each in a plurality of times, followed by drawing the product into wire rod at an area reduction shown in Table 3b below. Then, the wire rod was annealed for stress-relief at a predetermined temperature in the range of from 300° to 500° C. for 20 to 60 minutes, thus producing R-A-Cu-O based superconducting ceramics wire rods.

For comparison, R-A-Cu-O based superconducting ceramics powder having a mean grain size and composition shown in Table 4a was filled in the same cylindrical Ag casing as described above at a filling ratio of 50%. After sealing it in vacuo, the casing was immediately cold-processed under the same conditions as above to obtain wire rod, which was then heat-treated in the same manner as above to effect annealing for stress relief, thus producing comparative wire rods.

The theoretical density ratio, critical temperature (Tc) and critical current (Jc) of the superconducting ceramics wire rods thus obtained were determined and the results obtained are shown in Table 4c.

TABLE 3b

| Run | Theoretical Density Ratio Aft. HIP (%) | Area Reduction (%) | Diameter of Wire Rod (mm) | Heat Treatment | | Jc (A/cm$^2$) | Tc (°K.) |
|---|---|---|---|---|---|---|---|
| | | | | Theoretical Density Ratio (%) | Theoretical Oxygen Content Ratio (%) | | |
| 3-1 | 99.9 | 99 | 1.4 | 99.9 | 99.8 | 6900 | 93 |
| 3-2 | 98.8 | 99 | 1.4 | 99.8 | 99.7 | 3400 | 90 |
| 3-3 | 99.7 | 98 | 2.0 | 99.8 | 99.6 | 4100 | 87 |
| 3-4 | 99.9 | 95 | 3.1 | 99.9 | 99.8 | 5200 | 89 |
| 3-5 | 99.7 | 98 | 2.0 | 98.7 | 99.5 | 5500 | 89 |
| 3-6 | 99.6 | 98 | 2.0 | 99.7 | 99.9 | 4300 | 88 |
| 3-7 | 99.7 | 95 | 3.1 | 99.7 | 99.4 | 3700 | 87 |
| 3-8 | 99.7 | 95 | 3.1 | 99.8 | 99.7 | 4300 | 91 |
| 3-9 | 99.8 | 95 | 3.1 | 99.9 | 99.8 | 3500 | 85 |
| 3-10 | 99.6 | 98 | 2.0 | 99.8 | 99.8 | 4900 | 93 |
| 3-11 | 99.7 | 98 | 2.0 | 99.9 | 99.6 | 5200 | 92 |
| 3-12 | — | Same as 3-1 above | | 87.1 | 98.7 | 190 | 91 |
| 3-13 | — | Same as 3-2 above | | 84.3 | 98.7 | 40 | 88 |
| 3-14 | — | Same as 3-3 above | | 82.1 | 98.8 | 20 | 85 |
| 3-15 | — | Same as 3-4 above | | 83.5 | 98.8 | 30 | 88 |
| 3-16 | — | Same as 3-5 above | | 84.0 | 98.8 | 30 | 87 |
| 3-17 | — | Same as 3-6 above | | 84.9 | 98.8 | 40 | 85 |
| 3-18 | — | Same as 3-7 above | | 84.2 | 98.7 | 30 | 85 |
| 3-19 | — | Same as 3-8 above | | 84.0 | 98.9 | 60 | 90 |
| 3-20 | — | Same as 3-9 above | | 83.9 | 98.7 | 20 | 84 |
| 3-21 | — | Same as 3-10 above | | 85.4 | 98.7 | 140 | 91 |
| 3-22 | — | Same as 3-11 above | | 84.9 | 98.8 | 40 | 90 |

EXAMPLE 4

As starting powder, R$_2$O$_3$ powder, AO powder and CyO powder each having a predetermined mean grain size of from 0.5 to 10 um were blended at a blend ratio shown in Table 4a. After mixing, the resulting mixture was filled into a cylindrical casing made of Ag having a size of 17 mm in inner diameter, 1.5 mm thick and 200 mm long at a filling ratio of 50% and the casing was sealed in vacuo. Then, the thus-filled casing was was calcined by holding it in the air at a predetermined temperature of 850° to 950° C. to convert the powders From the results shown in Table 4c below, it can be seen that the superconducting ceramics wire rods fabricated according to the process of the present invention had a theoretical density ratio much higher than that of the comparative wire rods. These results correspond to high critical current and high critical temperature.

TABLE 4a

| Run No. | Starting Powder Composition (wt. %) | | |
|---|---|---|---|
| | R2O3 | AO | CuO |
| 4-1 | Y$_2$O$_3$: 17.15 | BaO: 46.59 | rem. |
| 4-2 | Er$_2$O$_3$: 25.97 | BaO: 41.63 | rem. |
| 4-3 | Dy$_2$O$_3$: 25.50 | BaO: 41.89 | rem. |
| 4-4 | Yb$_2$O$_3$: 26.54 | BaO: 41.32 | rem. |
| 4-5 | Cd$_2$O$_3$: 24.95 | BaO: 42.21 | rem. |
| 4-6 | Tm$_2$O$_3$: 26.13 | BaO: 41.55 | rem. |
| 4-7 | Nd$_2$O$_3$: 25.12 | BaO: 42.98 | rem. |
| 4-8 | Lu$_2$O$_3$: 26.73 | BaO: 41.21 | rem. |
| 4-9 | Sm$_2$O$_3$: 24.23 | BaO: 42.61 | rem. |
| 4-10 | Y$_2$O$_3$: 17.41 | BaO: 42.58 SrO: 3.20 | rem. |
| 4-11 | Lu$_2$O$_3$: 27.09 | BaO: 39.66 CaO: 0.76 | rem. |

TABLE 4a'

| Run No. | Starting Powder Composition (wt. %) | | | | Mean Grain Size (um) |
|---|---|---|---|---|---|
| | R | A | Cu | O | |
| 4-12 | Y: 13.3 | Ba: 41.2 | 28.6 | rem. | 0.9 |
| 4-13 | Er: 22.5 | Ba: 36.9 | 25.6 | rem. | 3.4 |
| 4-14 | Dy: 22.0 | Ba: 37.1 | 25.8 | rem. | 3.3 |
| 4-15 | Yb: 23.1 | Ba: 36.6 | 25.4 | rem. | 4.1 |
| 4-16 | Cd: 21.4 | Ba: 37.4 | 26.0 | rem. | 3.2 |
| 4-17 | Tm: 22.6 | Ba: 36.8 | 25.5 | rem. | 3.5 |
| 4-18 | Nd: 20.0 | Ba: 38.1 | 26.5 | rem. | 4.4 |
| 4-19 | Lu: 23.3 | Ba: 36.5 | 25.3 | rem. | 3.7 |
| 4-20 | Sm: 20.7 | Ba: 37.7 | 26.2 | rem. | 3.5 |
| 4-21 | Y: 13.5 | Ba: 37.7 Sr: 2.7 | 29.0 | rem. | 4.2 |
| 4-22 | Lu: 23.5 | Ba: 35.1 Ca: 0.5 | 25.7 | rem. | 3.2 |

TABLE 4b

| Run | Theoretical Density Ratio Aft. HIP (%) | Area Reduction (%) | Diameter of Wire Rod (mm) | Theoretical Density Ratio (%) | Jc (A/cm$^2$) |
|---|---|---|---|---|---|
| 4-1 | 99.9 | 98 | 2.0 | 99.9 | 6100 |
| 4-2 | 99.7 | 98 | 2.0 | 99.7 | 2900 |
| 4-3 | 99.7 | 90 | 3.8 | 99.8 | 3700 |
| 4-4 | 99.8 | 95 | 3.1 | 99.8 | 4900 |
| 4-5 | 99.7 | 95 | 3.1 | 99.8 | 5500 |
| 4-6 | 99.6 | 98 | 2.0 | 99.7 | 4200 |
| 4-7 | 99.8 | 98 | 2.0 | 99.9 | 3200 |
| 4-8 | 99.6 | 90 | 3.8 | 99.8 | 3100 |
| 4-9 | 99.8 | 90 | 3.8 | 99.8 | 3200 |
| 4-10 | 99.7 | 95 | 3.1 | 99.7 | 4200 |
| 4-11 | 99.6 | 95 | 3.1 | 99.7 | 4500 |
| 4-12 | — | Same as 4-1 above | | 87.0 | 110 |
| 4-13 | — | Same as 4-2 above | | 87.2 | 60 |
| 4-14 | — | Same as 4-3 above | | 84.9 | 70 |
| 4-15 | — | Same as 4-4 above | | 85.0 | 70 |
| 4-16 | — | Same as 4-5 above | | 82.1 | 50 |
| 4-17 | — | Same as 4-6 above | | 86.0 | 70 |
| 4-18 | — | Same as 4-7 above | | 85.1 | 70 |
| 4-19 | — | Same as 4-8 above | | 85.0 | 30 |
| 4-20 | — | Same as 4-9 above | | 86.5 | 40 |
| 4-21 | — | Same as 4-10 above | | 85.2 | 100 |
| 4-22 | — | Same as 4-11 above | | 84.1 | 40 |

EXAMPLE 5

As starting powder, R$_2$O$_3$ powder, AO powder and CuO powder each having a predetermined mean grain size of from 0.5 to 10 um were blended at a blend ratio shown in Table 5a below. After mixing, the resulting mixture was filled into a cylindrical casing made of Ag having a size of 17 mm in inner diameter, 1.5 mm thick and 200 mm long at a filling ratio of 50% and the casing was sealed in vacuo. Then, the thus-filled casing was placed in a conventional HIP apparatus. HIP treatment was performed under the conditions:

| Pressure: | 1600 atm |
|---|---|
| Temperature: | 850° C. |
| Retention Time: | 1 hour | thus forming a compressed body. The compressed body together with the metal casing was calcined by holding it in the air at a predetermined temperature in the range of 850° to 950° C. to convert the powders in the metal casing into superconducting ceramics. The superconducting ceramics compressed body (HIP-compressed calcined body) had a high theoretical density ratio shown in Table 5b. The compressed body was cold processed by subjecting it to swaging and grooved roll-processing, each in a plurality of times, followed by drawing the product into wire rod at an area reduction shown in Table 5a below. Then, the wire rod at an area reduction shown in Table 5a below. Then, the wire rod was annealed for stress-relief at a predetermined temperature in the range of from about 300° to 500° C. for 20 to 60 minutes, thus producing R-A-Cu-O based superconducting ceramics wire rods.

For comparison, R-A-Cu-O based superconducting ceramics powder having a mean grain size and composition shown in Table 5a' was filled in the same cylindrical Ag casing as described above at a filling ratio of 50%. After sealing it in vacuo, the casing was immediately cold processed under the same conditions as above to obtain wire rod, which was then heat-treated in the same manner as above to effect annealing for stress-relief, thus producing comparative wire rods.

The theoretical density ratio and critical current (Jc) of the superconducting ceramics wire rods thus obtained were determined and the results obtained are shown in Tables 5b.

From the results shown in Table 5b below, it can be seen that the superconducting ceramics wire rods fabricated according to the process of the present invention had a theoretical density ratio much higher than that of the comparative wire rods. These results correspond to high critical current.

TABLE 5a

| Run No. | Starting Powder Composition (wt. %) | | |
|---|---|---|---|
| | R$_2$O$_3$ | AO | CuO |
| 5-1 | Y$_2$O$_3$: 17.15 | BaO: 46.59 | rem. |
| 5-2 | Er$_2$O$_3$: 25.97 | BaO: 41.63 | rem. |
| 5-3 | Dy$_2$O$_3$: 25.50 | BaO: 41.89 | rem. |
| 5-4 | Yb$_2$O$_3$: 26.54 | BaO: 41.32 | rem. |
| 5-5 | Gd$_2$O$_3$: 24.95 | BaO: 42.21 | rem. |
| 5-6 | Tm$_2$O$_3$: 26.13 | BaO: 41.55 | rem. |
| 5-7 | Nd$_2$O$_3$: 23.58 | BaO: 42.98 | rem. |
| 5-8 | Lu$_2$O$_3$: 26.73 | BaO: 41.21 | rem. |
| 5-9 | Sm$_2$O$_3$: 24.23 | BaO: 42.61 | rem. |
| 5-10 | Y$_2$O$_3$: 17.41 | BaO: 42.58 SrO: 3.20 | rem. |
| 5-11 | Lu$_2$O$_3$: 27.09 | BaO: 39.66 CaO: 0.76 | rem. |

TABLE 5a'

| Run No. | Starting Powder Composition (wt. %) | | | | Mean Grain Size (um) |
|---|---|---|---|---|---|
| | R | A | Cu | O | |
| 5-12 | Y: 13.3 | Ba: 41.2 | 28.6 | rem. | 0.9 |

TABLE 5a'-continued

| Run No. | Starting Powder Composition (wt. %) | | | | Mean Grain Size (um) |
|---|---|---|---|---|---|
| | R | A | Cu | O | |
| 5-13 | Er: 22.5 | Ba: 36.9 | 25.6 | rem. | 3.1 |
| 5-14 | Dy: 22.0 | Ba: 37.1 | 25.8 | rem. | 3.0 |
| 5-15 | Yb: 23.1 | Ba: 36.6 | 25.4 | rem. | 3.8 |
| 5-16 | Cd: 21.4 | Ba: 37.4 | 26.0 | rem. | 3.0 |
| 5-17 | Tm: 22.6 | Ba: 36.8 | 25.5 | rem. | 3.5 |
| 5-18 | Nd: 20.0 | Ba: 38.1 | 26.5 | rem. | 3.2 |
| 5-19 | Lu: 23.3 | Ba: 36.5 | 25.3 | rem. | 3.4 |
| 5-20 | Sm: 20.7 | Ba: 37.7 | 26.2 | rem. | 3.7 |
| 5-21 | Y: 13.5 | Ba: 37.7<br>Sr: 2.7 | 29.0 | rem. | 4.1 |
| 5-22 | Lu: 23.5 | Ba: 35.1<br>Ca: 0.5 | 25.7 | rem. | 3.7 |

TABLE 5b

| Run | Theoretical Density Ratio Aft. HIP (%) | Area Reduction (%) | Diameter of Wire Rod (mm) | Theoretical Density Ratio (%) | Jc (A/cm²) |
|---|---|---|---|---|---|
| 5-1 | 99.8 | 98 | 2.0 | 98.8 | 5100 |
| 5-2 | 99.8 | 98 | 2.0 | 98.4 | 3100 |
| 5-3 | 99.7 | 98 | 2.0 | 99.1 | 3200 |
| 5-4 | 99.9 | 98 | 2.0 | 99.8 | 3000 |
| 5-5 | 99.6 | 95 | 3.1 | 97.9 | 3100 |
| 5-6 | 99.8 | 90 | 3.8 | 98.3 | 2900 |
| 5-7 | 99.6 | 90 | 3.8 | 99.0 | 3600 |
| 5-8 | 99.6 | 90 | 3.8 | 98.4 | 2900 |
| 5-9 | 99.7 | 90 | 3.8 | 98.8 | 3100 |
| 5-10 | 99.8 | 95 | 3.1 | 99.1 | 4300 |
| 5-11 | 99.7 | 95 | 3.1 | 98.9 | 3900 |
| 5-12 | — | 95 | 2.7 | 86.7 | 190 |
| 5-13 | — | 95 | 2.7 | 85.9 | 40 |
| 5-14 | — | 95 | 2.7 | 86.0 | 70 |
| 5-15 | — | 98 | 1.7 | 87.7 | 110 |
| 5-16 | — | 98 | 1.7 | 88.8 | 80 |
| 5-17 | — | 90 | 3.8 | 82.1 | 70 |
| 5-18 | — | 95 | 2.7 | 85.5 | 60 |
| 5-19 | — | 95 | 2.7 | 84.9 | 50 |
| 5-20 | — | 95 | 2.7 | 86.1 | 30 |
| 5-21 | — | 90 | 3.8 | 82.9 | 110 |
| 5-22 | — | 90 | 3.8 | 83.0 | 30 |

EXAMPLE 6

As starting powder, $R_2O_3$ powder, AO powder and CuO powder having a predetermined mean grain size of from 0.5 to 10 um and various metal oxide powders were blended at a blend ratio shown in Table 6a. After mixing, the resulting mixture was filled into a cylindrical casing made of Cu having a size of 17 mm in inner diameter, 1.5 mm thick and 200 mm long at a filling ratio of 50% and the casing was sealed in vacuo. The metal casing was calcined by holding it in the air at a predetermined temperature in the range of 850° to 950° C. to convert the powders in the metal casing into superconducting ceramics. Then, the thus-synthesized ceramics was then placed in a conventional HIP apparatus. HIP treatment was performed under the conditions:

| | |
|---|---|
| Pressure: | 1700 atm |
| Temperature: | 750° C. |
| Retention Time: | 4 hour | thus forming a compressed body having a theoretical density ratio shown in Table 6b. The superconducting ceramics compressed body (HIP-compressed calcined body) had a high theoretical density ratio shown in Table 6b. Then the compressed body was cold processed by subjecting it to swaging and grooved roll-process-ing, each in a plurality of times, followed by drawing the product into wire rod at an area reduction shown in Table 6b below. Then, the wire rod was heat-treated at a predetermined temperature in the range of from 300° to 500° C. for 10 to 20 minutes to effect annealing for stress-relief, thus producing R-A-Cu-O based superconducting ceramics wire rods.

For comparison, R-A-Cu-O based superconducting ceramics powder having a mean grain size and composition shown in Table 6a' was filled in the same cylindrical Cu casing as described above at a filling ratio of 50%. After sealing it in vacuo, the casing was immediately cold processed under the same conditions as above to obtain wire rod, which was then heat-treated in the same manner as above to effect annealing for stress-relief, thus producing comparative wire rods.

The theoretical density ratio, theoretical oxygen content ratio, critical temperature (Tc) and critical current (Jc) of the superconducting ceramics wire rods thus obtained were determined and the results obtained are shown in Tables 6b.

From the results shown in Tables 6a and 6b below, it can be seen that the superconducting ceramics wire rods fabricated according to the process of the present invention had a theoretical density ratio and theorethical oxygen content ratio much higher than those of the comparative wire rods. These results correspond to high critical current and high critical temperature.

TABLE 6a

| Run No. | Starting Powder Composition (wt. %) | | | Oxygen Supply Agent (wt. %) |
|---|---|---|---|---|
| | $R_2O_3$ | AO | CuO | |
| 6-1 | $Y_2O_3$: 16.81 | BaO: 45.66 | rem. | $Ag_2O$ 2 |
| 6-2 | $Er_2O_3$: 25.71 | BaO: 41.21 | rem. | $WO_3$ 1 |
| 6-3 | $Dy_2O_3$: 25.19 | BaO: 41.39 | rem. | $V_2O_3$ 1.2 |
| 6-4 | $Yb_2O_3$: 26.14 | BaO: 40.70 | rem. | $Ti_3O_5$ 1.5 |
| 6-5 | $Cd_2O_3$: 24.33 | BaO: 41.15 | rem. | $Ag_2O$ 2<br>$MnO_2$ 0.5 |
| 6-6 | $Tm_2O_3$: 25.82 | BaO: 41.05 | rem. | $MoO_3$ 1.2 |
| 6-7 | $Nd_2O_3$: 23.34 | BaO: 42.55 | rem. | $Ti_3O_5$ 1 |
| 6-8 | $Lu_2O_3$: 26.20 | BaO: 40.39 | rem. | $Ag_2O$ 1<br>$V_2O_3$ 0.5<br>$MoO_3$ 0.5 |
| 6-9 | $Sm_2O_3$: 23.50 | BaO: 41.33 | rem. | $MnO_2$ 3 |
| 6-10 | $Y_2O_3$: 16.54 | BaO: 40.45<br>SrO: 3.04 | rem. | $Ag_2O$ 5 |
| 6-11 | $Lu_2O_3$: 26.01 | BaO: 38.07<br>CaO: 0.73 | rem. | $WO_3$ 2<br>$Ti_3O_5$ 2 |

TABLE 6a'

| Run No. | Starting Powder Composition (wt. %) | | | | Mean Grain Size (um) |
|---|---|---|---|---|---|
| | R | A | Cu | O | |
| 6-12 | Y: 13.3 | Ba: 41.2 | 28.6 | rem. | 1.0 |
| 6-13 | Er: 22.5 | Ba: 36.9 | 25.6 | rem. | 3.3 |
| 6-14 | Dy: 22.0 | Ba: 37.1 | 25.8 | rem. | 3.1 |
| 6-15 | Yb: 23.1 | Ba: 36.6 | 25.4 | rem. | 3.8 |
| 6-16 | Cd: 21.4 | Ba: 37.4 | 26.0 | rem. | 3.0 |
| 6-17 | Tm: 22.6 | Ba: 36.8 | 25.5 | rem. | 3.5 |
| 6-18 | Nd: 20.0 | Ba: 38.1 | 26.5 | rem. | 3.3 |
| 6-19 | Lu: 23.3 | Ba: 36.5 | 25.3 | rem. | 3.2 |
| 6-20 | Sm: 20.7 | Ba: 37.7 | 26.2 | rem. | 3.6 |
| 6-21 | Y: 13.5 | Ba: 37.7<br>Sr: 2.7 | 29.0 | rem. | 4.2 |
| 6-22 | Lu: 23.5 | Ba: 35.1<br>Ca: 0.5 | 25.7 | rem. | 3.4 |

TABLE 6b

| Run | Theoretical Density Ratio Aft. HIP (%) | Area Reduction (%) | Diameter of Wire Rod (mm) | Oxidative Heat Treatment Theoretical Density Ratio (%) | Oxidative Heat Treatment Theoretical Oxygen Content Ratio (%) | Jc (A/cm²) | Tc (°K.) |
|---|---|---|---|---|---|---|---|
| 6-1 | 99.0 | 98 | 2.0 | 99.8 | 99.9 | 6100 | 99 |
| 6-2 | 99.2 | 98 | 2.0 | 99.7 | 99.9 | 2900 | 99 |
| 6-3 | 99.1 | 90 | 3.8 | 99.8 | 99.8 | 3650 | 97 |
| 6-4 | 99.3 | 95 | 3.1 | 99.9 | 99.9 | 4700 | 99 |
| 6-5 | 99.0 | 95 | 3.1 | 99.1 | 99.9 | 5000 | 99 |
| 6-6 | 99.6 | 98 | 2.0 | 99.9 | 99.8 | 4000 | 97 |
| 6-7 | 99.3 | 98 | 2.0 | 99.8 | 99.8 | 3200 | 96 |
| 6-8 | 99.5 | 90 | 3.8 | 99.9 | 99.8 | 3100 | 96 |
| 6-9 | 99.2 | 90 | 3.8 | 99.7 | 99.9 | 3100 | 99 |
| 6-10 | 99.4 | 95 | 3.1 | 99.7 | 99.9 | 4500 | 100 |
| 6-11 | 99.1 | 95 | 3.1 | 99.8 | 99.8 | 4100 | 90 |
| 6-12 | — | Same as 6-1 above | | 89.5 | 99.2 | 200 | 90 |
| 6-13 | — | Same as 6-2 above | | 88.3 | 99.1 | 50 | 88 |
| 6-14 | — | Same as 6-3 above | | 87.2 | 99.0 | 60 | 87 |
| 6-15 | — | Same as 6-4 above | | 84.5 | 99.0 | 100 | 88 |
| 6-16 | — | Same as 6-5 above | | 85.6 | 99.1 | 110 | 89 |
| 6-17 | — | Same as 6-6 above | | 83.3 | 99.1 | 20 | 89 |
| 6-18 | — | Same as 6-7 above | | 83.6 | 98.8 | 30 | 82 |
| 6-19 | — | Same as 6-8 above | | 89.0 | 99.0 | 190 | 85 |
| 6-20 | — | Same as 6-9 above | | 90.0 | 98.9 | 210 | 80 |
| 6-21 | — | Same as 6-10 above | | 82.1 | 99.2 | 15 | 92 |
| 6-22 | — | Same as 6-11 above | | 84.8 | 98.9 | 95 | 82 |

EXAMPLE 7

As starting powder, $R_2O_3$ powder, AO powder and CuO powder having a predetermined mean grain size of from 0.3 to 10 um and various metal oxide powders were blended at a blend ratio shown in Table 7a. After mixing, the resulting mixture was filled into a cylindrical casing made of Cu having a size of 17 mm in inner diameter, 1.5 mm thick and 200 mm long at a filling ratio of 50% and the casing was sealed in vacuo. Then, the thus-filled casing was placed in a conventional HIP apparatus. HIP treatment was performed under the conditions:

| | |
|---|---|
| Pressure: | 1700 atm |
| Temperature: | 750° C. |
| Retention Time: | 1 hour | thus forming a compressed body having a theoretical density rato shown in Table 7b. The compressed body together with the metal casing was calcined by holding it in the air at a predetermined temperature in the range of 850° to 950° C. to convert the compressed powders in the metal casing into superconducting ceramics. The superconducting ceramics compressed body (HIP-compressed calcined body) had a high theoretical density ratio shown in Table 7b. The compressed body was cold processed by subjecting it to swaging and grooved roll-processing, each in a plurality of times, followed by drawing the product into wire rod at an area reduction shown in Table 7a below. Then, the wire rod was annealed for stress-relief at a predetermined temperature in the range of from 300° to 500° C. for 10 to 20 minutes, thus producing R-A-Cu-O based superconducting ceramics wire rods.

The comparison, R-A-Cu-O based superconducting ceramics powder having a mean grain size and composition shown in Table 7a' was filled in the same cylindrical Cu casing as described above at a filling ratio of 50%. After sealing it in vacuo, the casing was immediately cold processed under the same conditions as above to obtain wire rod, which was then heat-treated in the same manner as above to effect annealing for stress-relief, thus producing comparative wire rods.

The theoretical density ratio, theoretical oxygen content ratio, critical current (Jc) and critical temperature (Tc) of the superconducting ceramics wire rods thus obtained were determined and the results obtained are shown in Tables 7b.

From the results shown in Tables 7b below, it can be seen that the superconducting ceramics wire rods fabricated according to the process of the present invention had a theoretical density ratio much higher than that of the comparative wire rods. These results correspond to high critical current.

TABLE 7a

| Run No. | Starting Powder Composition (wt. %) | | | Oxygen Supply Agent (wt. %) | |
|---|---|---|---|---|---|
| | $R_2O_3$ | AO | CuO | | |
| 7-1 | $Y_2O_3$: 16.81 | BaO: 45.66 | rem. | $Ag_2O$ | 2 |
| 7-2 | $Er_2O_3$: 25.71 | BaO: 41.21 | rem. | $WO_3$ | 1 |
| 7-3 | $Dy_2O_3$: 25.19 | BaO: 41.39 | rem. | $V_2O_3$ | 1.2 |
| 7-4 | $Yb_2O_3$: 26.14 | BaO: 40.70 | rem. | $Ti_3O_5$ | 1.5 |
| 7-5 | $Gd_2O_3$: 24.33 | BaO: 41.15 | rem. | $Ag_2O$ | 2 |
| | | | | $MnO_2$ | 0.5 |
| 7-6 | $Tm_2O_3$: 25.82 | BaO: 41.05 | rem. | $MoO_3$ | 1.2 |
| 7-7 | $Nd_2O_3$: 23.34 | BaO: 42.55 | rem. | $Ti_3O_5$ | 1 |
| 7-8 | $Lu_2O_3$: 26.20 | BaO: 40.39 | rem. | $Ag_2O$ | 1 |
| | | | | $V_2O_3$ | 0.5 |
| | | | | $MoO_3$ | 0.5 |
| 7-9 | $Sm_2O_3$: 23.50 | BaO: 41.33 | rem. | $MnO_2$ | 3 |
| 7-10 | $Y_2O_3$: 16.54 | BaO: 40.45 | rem. | $Ag_2O$ | 5 |
| | | SrO: 3.04 | | | |
| 7-11 | $Lu_2O_3$: 26.01 | BaO: 38.07 | rem. | $WO_3$ | 2 |
| | | CaO: 0.73 | | $Ti_3O_5$ | 2 |

TABLE 7a'

| Run No. | Starting Powder Composition (wt. %) | | | | Mean Grain Size (um) |
|---|---|---|---|---|---|
| | R | A | Cu | O | |
| 7-12 | Y: 13.3 | Ba: 41.2 | 28.6 | rem. | 1.0 |
| 7-13 | Er: 22.5 | Ba: 36.9 | 25.6 | rem. | 3.3 |
| 7-14 | Dy: 22.0 | Ba: 37.1 | 25.8 | rem. | 3.1 |

TABLE 7a'-continued

| Run No. | Starting Powder Composition (wt. %) | | | | Mean Grain Size (um) |
|---|---|---|---|---|---|
| | R | A | Cu | O | |
| 7-15 | Yb: 23.1 | Ba: 36.6 | 25.4 | rem. | 3.8 |
| 7-16 | Gd: 21.4 | Ba: 37.4 | 26.0 | rem. | 3.0 |
| 7-17 | Tm: 22.6 | Ba: 36.8 | 25.5 | rem. | 3.5 |
| 7-18 | Nd: 20.0 | Ba: 38.1 | 26.5 | rem. | 3.3 |
| 7-19 | Lu: 23.3 | Ba: 36.5 | 25.3 | rem. | 3.2 |
| 7-20 | Sm: 20.7 | Ba: 37.7 | 26.2 | rem. | 3.6 |
| 7-21 | Y: 13.5 | Ba: 37.7  Sr: 2.7 | 29.0 | rem. | 4.2 |
| 7-22 | Lu: 23.5 | Ba: 35.1  Ca: 0.5 | 25.7 | rem. | 3.4 |

TABLE 7b

| Run | Theoretical Density Ratio Aft. HIP (%) | Area Reduction (%) | Diameter of Wire Rod (mm) | Oxidative Heat Treatment | | Jc (A/cm$^2$) | Tc (°K.) |
|---|---|---|---|---|---|---|---|
| | | | | Theoretical Density Ratio (%) | Theoretical Oxygen Content Ratio (%) | | |
| 7-1 | 99.8 | 98 | 2.0 | 99.9 | 99.9 | 6000 | 99 |
| 7-2 | 99.6 | 98 | 2.0 | 99.8 | 99.9 | 2850 | 95 |
| 7-3 | 99.7 | 90 | 3.8 | 99.7 | 99.8 | 3600 | 93 |
| 7-4 | 99.4 | 95 | 3.1 | 99.7 | 99.9 | 4700 | 99 |
| 7-5 | 99.3 | 95 | 3.1 | 99.8 | 99.9 | 5300 | 100 |
| 7-6 | 99.4 | 98 | 2.0 | 99.9 | 99.8 | 4000 | 95 |
| 7-7 | 99.5 | 98 | 2.0 | 99.5 | 99.8 | 3100 | 92 |
| 7-8 | 99.8 | 90 | 3.8 | 99.8 | 99.8 | 3000 | 90 |
| 7-9 | 99.5 | 90 | 3.8 | 99.7 | 99.8 | 3000 | 93 |
| 7-10 | 99.2 | 95 | 3.1 | 99.6 | 99.9 | 4000 | 99 |
| 7-11 | 99.3 | 95 | 3.1 | 99.7 | 99.8 | 4000 | 90 |
| 7-12 | — | Same as 7-1 above | | 89.5 | 99.2 | 200 | 90 |
| 7-13 | — | Same as 7-2 above | | 88.3 | 99.1 | 50 | 88 |
| 7-14 | — | Same as 7-3 above | | 87.1 | 99.0 | 60 | 87 |
| 7-15 | — | Same as 7-4 above | | 83.7 | 99.0 | 80 | 88 |
| 7-16 | — | Same as 7-5 above | | 84.5 | 99.0 | 100 | 88 |
| 7-17 | — | Same as 7-6 above | | 82.7 | 99.0 | 20 | 86 |
| 7-18 | — | Same as 7-7 above | | 83.6 | 98.9 | 40 | 82 |
| 7-19 | — | Same as 7-8 above | | 88.5 | 99.0 | 200 | 85 |
| 7-20 | — | Same as 7-9 above | | 89.0 | 99.1 | 190 | 87 |
| 7-21 | — | Same as 7-10 above | | 83.4 | 99.0 | 100 | 86 |
| 7-22 | — | Same as 7-11 above | | 85.6 | 98.9 | 160 | 82 |

PREPARATION EXAMPLE 1

As starting powders are provided yttrium oxide ($Y_2O_3$) powder having a mean grain size of 6 um, barium carbonate ($BaCO_3$) powder having a mean grain size of 6 um, and copper oxide (CuO) powder having a mean grain size of 6 um. These powders were blended at a blend ratio as follows:

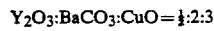

and well mixed. The resulting mixt powder was calcined in the air at a temperature of 900° C. for 12 hours to produce a compound having a composition of $YBa_2Cu_3O_7$ and a perovskite structure. The compound was then pulverized to obtain superconducting ceramics powder having a mean grain size of 1.3 um.

PREPARATION EXAMPLE 2

As starting powders are provided yttrium oxide ($Y_2O_3$) powder having a mean grain size of 6 um, barium carbonate ($BaCO_3$) powder having a mean grain size of 6 um, and copper oxide (CuO) powder having a mean grain size of 6 um. These powders were blended at a blend ratio by weight of:

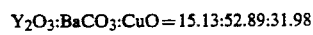

and well mixed. The resulting mixt powder was calcined in the air at a temperature of 900° C. for 20 hours to produce a compound having a composition of $YBa_2Cu_3O_7$ and a perovskite structure. The compound was then pulverized to obtain superconducting ceramics powder having a mean grain size of 5 um.

EXAMPLE 8

The superconducting ceramics powder obtained in Preparation Example 1 above was filled in a Cu tube having a size of 23 mm in outer diameter, 20 mm in inner diameter, and 200 mm in height. The tube was processed by swaging and further processed using a die to fabricate a superconducting ceramics wire rod having a diameter of 1 mm. The wire rod was cut into three equal parts. Two of them were worked into coils each having a diameter of 30 mm. One of the thus-obtained superconducting ceramics coils was further subjected to HIP treatment under the conditions:

| | |
|---|---|
| Pressure: | 2000 atm |
| Temperature: | 800° C. |
| Retention Time: | 1 hour |

The superconducting ceramics wire rod, superconducting ceramics coil and HIP-treated superconducting ceramics coil were each measured for their critical temperature Tc (° C.) and critical current density (A/cm$^2$) at 77° K. The results obtained are shown in Table 8 below.

TABLE 8

| Article | Tc (°K.) | Jc (A/Cm$^2$) |
|---|---|---|
| Wire Rod | 94 | 320 |
| Coil | 92 | 70 |
| HIP-treated Coil | 94 | 2600 |

EXAMPLE 9

The superconducting ceramics powder obtained in Preparation Example 1 above was filled in an Ag tube having a size of 23 mm in outer diameter, 20 mm in inner diameter, and 200 mm in height. The tube was processed with grooved rolls and further processed using a die to fabricate a superconducting ceramics wire rod having a diameter of 2 mm. The wire rod was cut into three equal parts. Two of them were worked into coils each having a diameter of 50 mm. One of the thus-obtained superconducting ceramics coils was further subjected to HIP treatment under the conditions:

| Pressure: | 2000 atm |
|---|---|
| Temperature: | 800° C. |
| Retention Time: | 1 hour |

The superconducting ceramics wire rod, superconducting ceramics coil and HIP-treated superconducting ceramics coil were each subjected to oxidative heat-treatment under the conditions:

| Partial Pressure of Oxygen: | 2 atm |
|---|---|
| Temperature: | 850° C. |
| Retention Time: | 100 minutes |

The thus-treated article were measured for their respective critical temperature Tc (° K) and critical current Jc (A/cm$^2$). The results obtained are shown in Table 9 below.

TABLE 9

| Article | Tc (°K.) | Jc (A/Cm$^2$) |
|---|---|---|
| Wire Rod | 95 | 430 |
| Coil | 94 | 60 |
| HIP-treated Coil | 95 | 3400 |

EXAMPLE 10

The superconducting ceramics powder obtained in Preparation Example 2 and AgO powder having a mean grain size of 6 μm which was provided as a starting powder were blended at a blend ratio shown in Table 10 below and well mixed. The resulting mixt powder was filled in an Ag tube having a size of 20 mm in inner diameter, and 1.5 mm thick, and the tube was processed by rotary swaging to reduce size to 3 mm in diameter and then processed using a die to fabricate a wire rod having a diameter of 1 mm. The wire was worked into a coil of 30 mm in diameter. The coil thus-obtained was subjected to HIP treatment under the conditions:

| Pressure | 2000 atm |
|---|---|
| Temperature | 800° C. |
| Retention Time | 1.0 hour |

The HIP-treated superconducting ceramics coil was measured for its critical temperature Tc (°C.) and critical current density (A/cm$^2$) at 77° K.

For comparison, the same procedures as above were repeated except that mixt powder containing AgO in amounts outside the preferred range was used.

The results obtained are shown in Table 10 below in which Runs 1 to 5 are according to this invention and Runs 6 to 9 are comparative ones.

TABLE 10

| | Composition of Mixt Powder | | Characteristics of Coil | |
|---|---|---|---|---|
| Run | AgO | YBa$_2$Cu$_3$O$_7$ | Tc | Jc |
| 1 | 1.0 | remainder | 96 | 4900 |
| 2 | 2.0 | remainder | 98 | 5200 |
| 3 | 3.0 | remainder | 98 | 5700 |
| 4 | 4.0 | remainder | 97 | 5600 |
| 5 | 5.0 | remainder | 97 | 4900 |
| 6 | —* | remainder | 87 | 1410 |
| 7 | 0.5* | remainder | 90 | 2650 |
| 8 | 6.0* | remainder | 89 | 2530 |
| 9 | 7.0* | remainder | 79 | 1200 |

Note:
The symbol "*" indicates that the conditions used were outside the scope of this invention.

EXAMPLE 11

The HIP-treated superconducting ceramics Ag wire rod coil obtained in Run No. 6 in Example 10 above was subjected to oxidative heat-treatment under the conditions:

| Partial Pressure of Oxygen: | 2 atm |
|---|---|
| Temperature: | 850° C. |
| Retention Time: | 10 minutes |

The critical temperature Tc (°K.) and critical current Jc (A/cm$^2$) of the thus-treated coil which were measure are as follows:

| Critical Temperature Tc: | 97° K. |
|---|---|
| Critical Current Jc: | 4300 A/cm$^2$ |

These values are comparable to those of Run Nos. 1 to 5 in Example 10.

Obviously many modifications and variations of the present invention are possible in the light of the above teachings. It is therefore, to be understood that within the scope of the appended claims the invention may be practicesd otherwise than as specidically described.

What is claimed is:

1. A process for fabricating worked superconducting ceramic material of a mean grain size not more than 10 μm, said process comprising the steps of:
    (a) preparing a metal casing containing a starting powder material having a composition for forming an oxide superconductor, comprising:
      an oxide of a yttrium-including rare earth element, an oxide of an alkaline metal, and copper oxide,;
    (b) calcining the starting powder material contained in the casing at a temperature in the range of 850° to 950° C.;
    (c) subjecting said casing to hot deformation processing at a pressure in the range of 1600 to 1700 atmospheres and at a temperature in the range of 750° to 850° C. for about one hour;
    (d) subjecting said casing containing hot deformed material to cold deformation processing, including wire drawing; and
    (e) subjecting said casing to stress relief treatment by annealing in the presence of oxygen.

2. The process of fabricating worked superconducting ceramic material as claimed in claim 1, wherein said step (b) is performed after said step (c).

3. The process of fabricating worked superconducting ceramic material as claimed in claim 1, wherein said step (b) is performed after said step (d).

4. The process of fabricating worked superconducting ceramic material as claimed in claim 1, wherein said starting material contains an oxygen supply agent selected from the group consisting of the oxides of silver, copper, tungsten, vanadium, titanium, manganese and molybdenum.

5. The process of fabricating worked superconducting ceramic material as claimed in claim 1, wherein said starting material consists essentially of non-superconducting powder materials blended in a ratio of a targeted superconducting material.

6. The process of fabricating worked superconducting ceramic material as claimed in claim 1, wherein said casing is provided with an oxide layer on the inner surface.

7. The process of fabricating worked superconducting ceramic material as claimed in claim 1, wherein said metal casing is formed of metal selected from the group consisting of silver, copper, aluminum and alloys thereof.

8. The process of fabricating worked superconducting ceramic material as claimed in claim 1, wherein said step (d) is performed after the step (e).

9. The process of fabricating worked superconducting ceramic material as claimed in claim 1, wherein said cold deformation processing produces wires and fine rods.

10. The process of fabricating worked superconducting ceramic material as claimed in claim 1, wherein said annealing is performed at a temperature in the range of 300° C. to 500° C.

* * * * *